United States Patent [19]

Frank

[11] Patent Number: 5,126,827
[45] Date of Patent: Jun. 30, 1992

[54] SEMICONDUCTOR CHIP HEADER HAVING PARTICULAR SURFACE METALLIZATION

[75] Inventor: Michael L. Frank, Los Gatos, Calif.

[73] Assignee: Avantek, Inc., Milpitas, Calif.

[21] Appl. No.: 642,412

[22] Filed: Jan. 17, 1991

[51] Int. Cl.$^5$ .................. H01L 23/12; H01L 23/14
[52] U.S. Cl. ................................. 357/74; 357/80
[58] Field of Search .................. 357/68, 80, 74, 69

[56] References Cited

U.S. PATENT DOCUMENTS

| | | | |
|---|---|---|---|
| 3,651,434 | 3/1972 | McGeough et al. | 357/74 |
| 3,663,868 | 5/1972 | Noguchi et al. | 357/74 |
| 3,936,864 | 2/1976 | Benjamin | 357/74 |
| 4,023,198 | 5/1977 | Malone et al. | 357/81 |
| 4,150,393 | 4/1979 | Wilson et al. | 357/74 |
| 4,172,261 | 10/1979 | Tsuzuki et al. | 357/81 |
| 4,534,103 | 8/1985 | Cho et al. | 29/571 |
| 4,649,416 | 3/1987 | Borkowski et al. | 357/74 |
| 4,788,584 | 11/1988 | Hirano et al. | 357/74 |
| 4,825,282 | 4/1989 | Fukaya | 357/74 |
| 4,841,353 | 6/1989 | Wada et al. | 357/51 |
| 4,992,851 | 2/1991 | Platzoeder et al. | 357/74 |

Primary Examiner—Andrew J. James
Assistant Examiner—S. V. Clark
Attorney, Agent, or Firm—Limbach & Limbach

[57] ABSTRACT

A semiconductor chip header includes an electrically insulative base member having a centrally located aperture and electrically separate metalizations. Where the semiconductor chip is a transistor, two metalizations originate on the top surface of the base member on opposing sides of the aperture, wrap around the outer edges and terminate on the bottom surface of the base member. These metalizations' termination areas are for connecting two ribbon leads (e.g. via eutectic bonding) during final assembly and packaging of a transistor. A third metalization is deposited upon a portion of the bottom surface of the base member, and surrounds the aperture. The third metalization is for connecting a third ribbon lead covering the aperture during final assembly. The aperture allows a transistor chip to be positioned therein during final assembly with its bottom chip surface (e.g. substrate) bonded directly to the third ribbon lead. This provides for minimum electrical and thermal impedances in the electrical and thermal paths between the semiconductor chip's terminals and substrate, respectively, and the third ribbon lead.

16 Claims, 2 Drawing Sheets

SEMICONDUCTOR CHIP HEADER HAVING PARTICULAR SURFACE METALLIZATION

BACKGROUND OF THE INVENTION

1. Field of the Invention

The present invention relates to semiconductor chip packages, and in particular, to dielectric headers used for mounting microwave semiconductor chips.

2. Description of the Related Art

Conventional discreet semiconductor devices (e.g. transistors) are typically encapsulated in packages consisting of a frame, or header, and a cover, from which multiple electrical leads protrude for providing electrical access to the active terminals of the semiconductor chip therein. The chip is typically mounted directly on the frame or header, e.g. via conductive or nonconductive epoxy, eutectic bonding, etc. The active terminals of the chip (e.g. the base, emitter and collector for a bipolar junction transistor ("BJT"), or the gate, source and drain for a field-effect transistor ("FET")) are coupled to the electrical leads, typically via wire bonds.

If the bottom surface (e.g. substrate) of the chip serves as one of the active terminals of the device (e.g. the collector for a BJT), an electrically conductive frame or header can be used and the chip can be conductively mounted thereto, such as by eutectically bonding its bottom surface to the conductive header. An example of this is illustrated in FIG. 1, wherein a transistor chip 10 is conductively coupled to, or mounted on, conductive metalization 12 deposited upon a dielectric header 14. Typically, such conductive coupling or mounting is done by eutectically bonding the transistor chip 10 to the metalization 12. The metalization 12 extends to and around a portion of the periphery 16 to the bottom side of the header 14 (often referred to as "wraparound").

Additional areas of metalization 18, 20, 22 are disposed near the mounting area of the transistor chip 10 so as to allow connections to be made to the terminal pads of the transistor chip 10. These connections are typically made by way of wire bonds 24, 26, 28, which are well known in the art.

These additional areas of metalization 18, 20, 22 also extend around portions of the periphery 16 to the bottom surface of the header 14. This extension of the metalizations 12, 18, 20, 22 to the bottom surface of the header 14 provides conductive paths for conductive electrical lead: 30, 32, 34, 36, which are used for electrically coupling the packaged transistor device into a circuit (not shown).

Two problems are associated with this mounting, or packaging, technique of transistor chips. The first problem, and typically the more serious problem, is the parasitic electrical impedance introduced by this transistor mounting technique. The second problem relates to the thermal impedance introduced, i.e. impedance to heat transfer from the transistor chip 10 to the heat sinking afforded by the transistor package leads 30, 32, 34, 36 and the circuit board to which it is typically soldered (not shown).

With respect to the problem of the parasitic electrical impedance, the wire bond and header metalization coupling each transistor terminal to its respective electrical lead presents undesirable parasitic electrical impedance. For example, the wire bond 26 and header metalization 20 coupling the base terminal 38 of the transistor chip 10 to its electrical lead 34 has an electrical line length associated therewith, thereby introducing parasitic inductance, as well as finite amounts of parasitic capacitance and resistance. Even where a wire bond is not used, such as in the connection of the collector terminal of the transistor chip 10 which is typically the bottom surface thereof, the electrical line length associated with its header metalization 12 nonetheless introduces parasitic inductance, capacitance and resistance. This problem is particularly acute at radio frequencies ("RF"), e.g. microwave.

With respect to the problem of thermal impedance, the internal heat generated within the transistor chip 10 during operation must pass through the header metalization 12 or the dielectric header 14 to reach the electrical leads 30, 32, 34, 36 in order to be dissipated by the lead sinking afforded thereby, as well as the heat sinking afforded by the circuit board to which the transistor package is normally connected (not shown).

Therefore, it would be desirable to have a semiconductor chip mounting or packaging technique which minimizes the parasitic electrical and thermal impedances associated with current semiconductor chip headers.

SUMMARY OF THE INVENTION

A semiconductor chip header in accordance with the present invention consists of a dielectric header having an aperture. A metalization near the aperture on the top surface of the header wraps around an area of the header periphery to the bottom side. This allows an electrical lead to be conductively coupled thereto. A second metalization can be similarly provided for conductively coupling a second electrical lead thereto. Any terminal pads on the top of the semiconductor chip can be wire-bonded to the metalizations disposed on the top surface of the header.

A third electrical lead can be attached to the bottom surface of the header in such a manner as to at least partially cover the aperture. A semiconductor chip can be mounted within the aperture directly to the third electrical lead. The mounting of the semiconductor chip directly to the third electrical lead minimizes the electrical and thermal paths presented to the substrate terminal of the semiconductor chip, thereby minimizing parasitic electrical and thermal impedances.

These and other objectives, features and advantages of the present invention will be understood upon consideration of the following detailed description of the invention and the accompanying drawings.

DETAILED DESCRIPTION OF THE INVENTION

Figure 1:
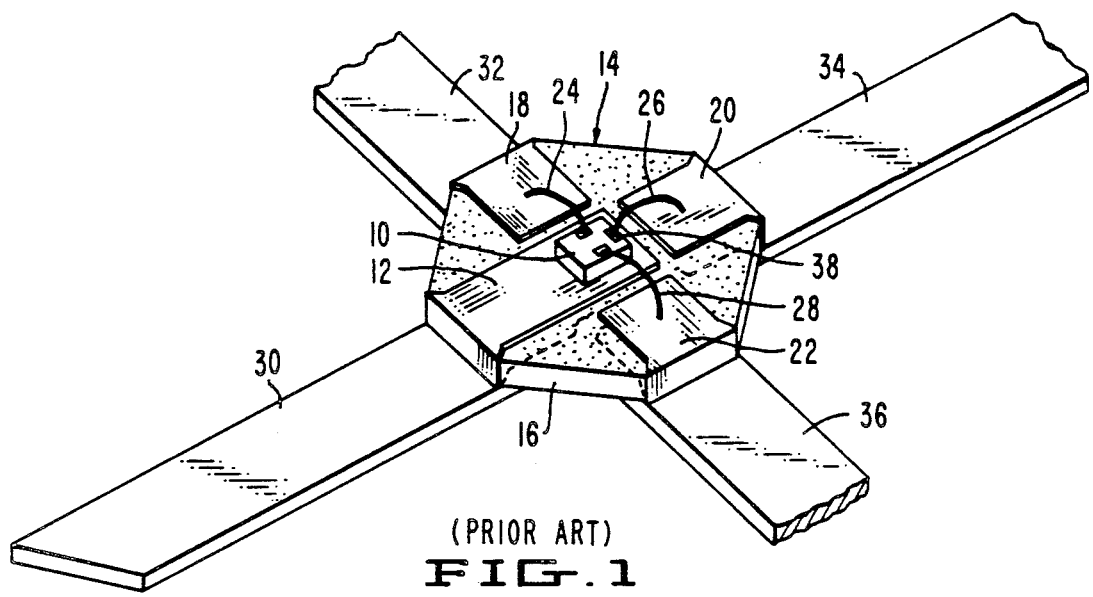
FIG. 1 illustrates a conventional transistor header with metalization areas and a transistor chip mounted thereon.
Figure 2:
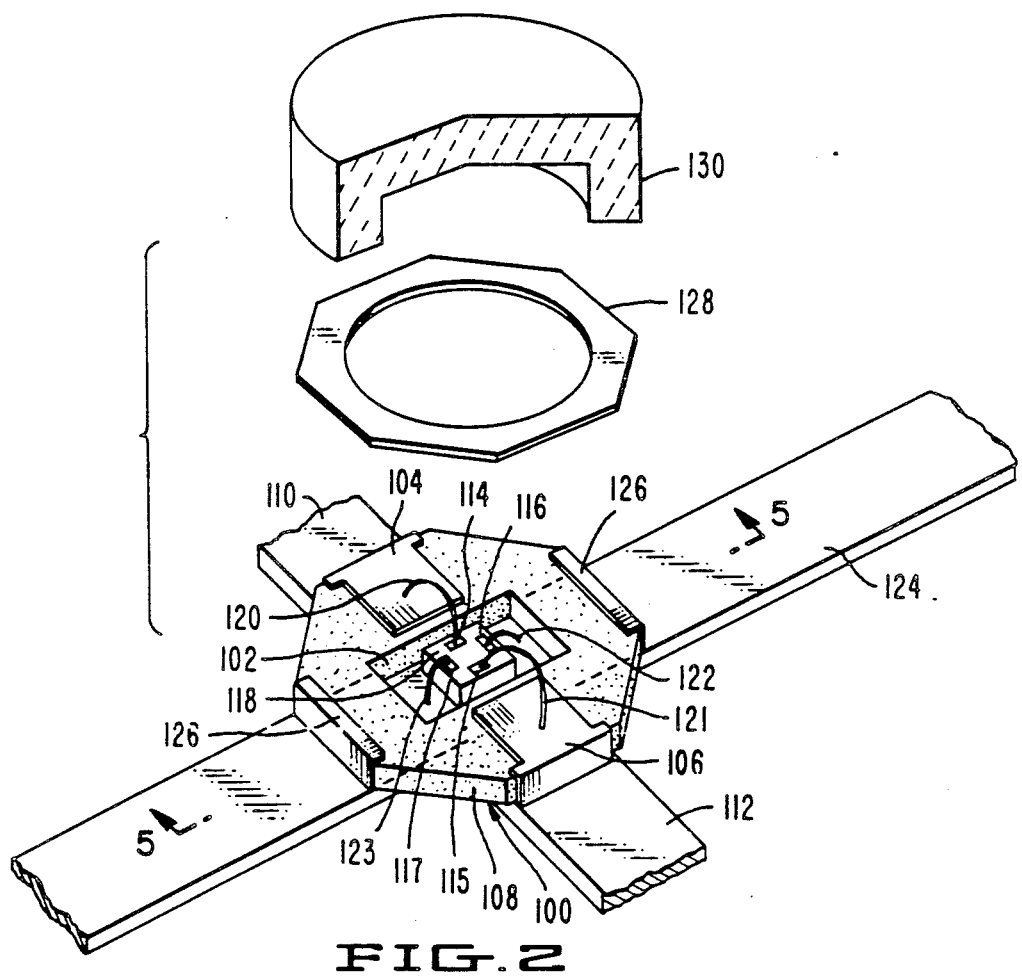
FIG. 2 illustrates a semiconductor chip header in accordance with the present invention with metalization areas and a transistor chip mounted therein.

Referring to FIG. 2, a semiconductor chip header 100 in accordance with a preferred embodiment of the present invention has a centrally disposed aperture 102, within which a transistor chip 118 is placed. The header 100 is substantially planar and octagonal in shape and fabricated from a dielectric material, such as alumina ceramic ($Al_2O_3$). However, it should be understood that the header 100 of the present invention can be of virtually any substantially planar shape, and the aperture 102 can be disposed therein as desired and of shapes other than rectangular. It should be further understood that the header 100 can be fabricated from other dielectric materials, such as aluminum nitride (AlN), as desired.

Adjacent to and on opposing sides of the aperture 102 are two metalizations 104, 106. These metalizations 104, 106 extend into, i.e. wrap around, portions of the periphery 108 of the header 100 and onto portions of the bottom surface thereof (discussed more fully below). Conductively coupled, or bonded, thereto are two electrical leads 110, 112 for providing connectivity within an external circuit, e.g. on a printed circuit board (not shown). To complete this connectivity, two terminal pads 114, 115 of the transistor chip 118 are coupled to these header metalizations 104, 106 via two wire bonds 120, 121.

These metalizations 104, 106 can be controlled impedance lines, e.g. microstriplines, which, as is well known in the art, will have specific dimensions (e.g. thickness and width) which are dependent upon, among other things, the dielectric constant of the header 100. For example, in a preferred embodiment the header will be fabricated from $Al_2O_3$ with a thickness of 0.010 inch (10 mils) and a dielectric constant of approximately 9.9. Therefore, based upon formulas or charts well known in the art, the width and thickness of each of these metalizations 104, 106 will be 0.010 inch (10 mils) and 0.00014 inch (0.14 mil), respectively.

A third header metalization 126 is deposited upon the header 100, extending from the top surface of the header 100 on one side of the aperture 102, around a portion of the periphery 108, across the bottom surface of the header 100, and up around another portion of the periphery 108 to the top surface of the header 100 on the opposing side of the aperture 102, as shown in FIG. 2 (discussed more fully below). Conductively coupled, or bonded, thereto is an electrical lead 124 for providing connectivity within an external circuit, e.g. on a printed circuit board (not shown). To complete this connectivity, two terminal pads 116, 117 of the transistor chip 118 are coupled to this electrical lead 124 via two wire bonds 122, 123

The materials from which the metalizations 104, 106, 126 are typically fabricated include, without limitation, 0.00006 inch (0.06 mil) of gold (Au) over 0.00008 inch (0.08 mil) of nickel (Ni). The metalizations 104, 106, 126 are typically deposited upon the header 100 by first screening tungsten oxide onto the unfired alumina. Upon firing, the tungsten oxide is reduced to tungsten metal. This metal is then used as a conductor in an electroplating process in which the nickel and gold are deposited to constitute the primary path of electrical conduction.

For the particular embodiment of the present invention illustrated in FIG. 2, a microwave field-effect transistor ("FET") chip 118 is illustrated, thereby requiring three electrical connections via the four terminal pads 114, 115, 116, 117 on the top surface thereof. Two terminal pads 114, 115 provide separate connectivity for the FET's gate and drain, while two other terminal pads 116, 117 provide connectivity for the FET's source.

The bottom surface, e.g. substrate, of the transistor chip 118 is bonded to the top surface of the electrical lead 124 disposed beneath the aperture 102.

It should be appreciated that another type of semiconductor chip device, such as a diode, bipolar junction transistor ("BJT") or microwave monolithic integrated circuit ("MMIC") can also be mounted within a header according to the present invention, with fewer or additional wire bonds or metalizations deposited upon the header, as desired. Further, it should be appreciated that a header according to the present invention can include multiple apertures for the mounting therein of multiple chip devices, e.g. as for a hybrid microelectronic circuit.

It should be further appreciated that, by mounting the transistor chip 118 as illustrated in FIG. 2, the parasitic electrical and thermal impedances of the electrical and thermal paths associated with the terminals and substrate of the transistor chip 118, respectively, are minimized significantly. The FET's source terminals 116, 117, being wire-bonded directly to the electrical lead 124 providing external connectivity, will have minimal parasitic electrical impedance between them and the external circuitry (not shown) to which they are thereby coupled. Further, wit the substrate of the transistor chip 118 bonded directly to the electrical lead 124 providing external connectivity, the thermal path over which the heat generated within the chip 118 must travel to be dissipated by the heat sinking afforded by the lead 124 and its external connections is minimized significantly.

It should be still further appreciated that the parasitic electrical impedance of the electrical path associated with one or more of the terminals of a transistor chip can be further minimized. For example, if the bottom surface of the chip substrate were configured to be one of the electrical terminals, that terminal can be conductively bonded directly to the electrical heat 124 providing external connectivity. This will eliminate the electrical impedance associated with a wire bond (e.g. the wire bonds 122, 123 for the source terminals 116, 117 of the FET chip 118 in FIG. 2), thereby further minimizing, or virtually eliminating, the electrical impedance between that terminal and the external circuitry (not shown) to which it is thereby coupled. Examples of such chip configurations include, without limitation, MMIC chips with wraparound terminal connections (e.g. wraparound ground), BJT chips having vertical structures wherein the substrate forms the collector terminal, or diode chips having vertical structures wherein the substrate forms the anode or cathode terminal.

Packaging, or encapsulation, of the transistor chip 118 within the header 100 is completed by the mounting of a non-conductive spacer 128 and cap, or lid, 130 upon the top surface of the header 100. The use of the spacer 128 and the internal cavity within the cap 130 provide clearance for the wire bonds 120, 122. A typical fabrication material for the spacer 128 and cap 130 includes, without limitation, alumina ($Al_2O_3$)

Figure 3:
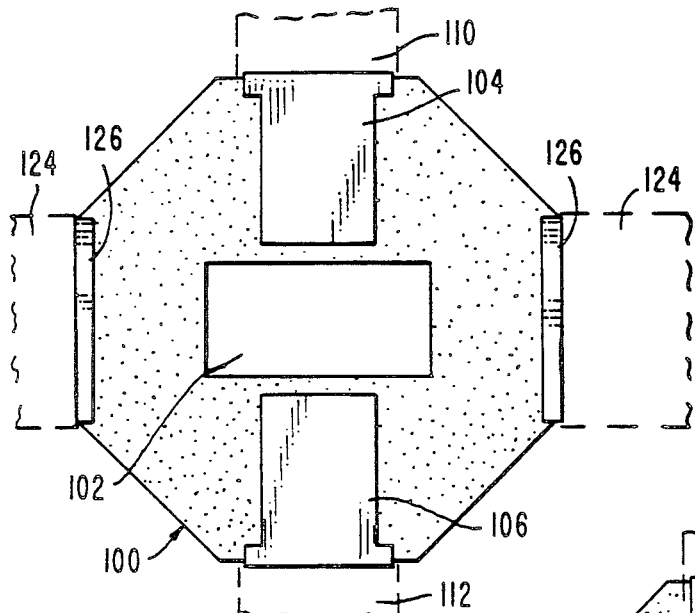
FIG. 3 illustrates a top view of the header of FIG. 2.
Figure 4:
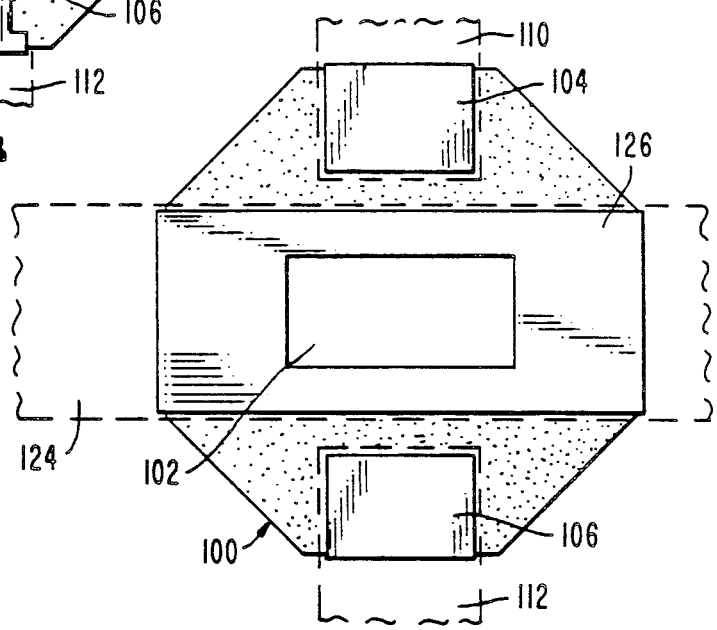
FIG. 4 illustrates a bottom view of the header of FIG. 2.

Referring to FIGS. 3 and 4, the structure of the header 100 of FIG. 2 can be better understood. FIGS. 3 and 4 illustrate top and bottom plan views of the header 100, respectively. As discussed above, adjacent to and on opposing sides of the centrally disposed aperture 102, are two metalizations 104, 106 which wrap around opposing areas of the outer periphery 108 of the header 100, to extend to areas on both the top and bottom sides of the header 100. Disposed substantially perpendicularly thereto is a third header metalization 126 extending from the top surface of the header 100 on one side of the aperture 102, around an area of the periphery 108, across the bottom surface of the header 100, around another area of the periphery 108 and onto a portion of the top surface of the header 100 on the opposing side of the aperture 102. The electrical leads 110, 112, 124 (e.g. ribbon leads), as discussed above, are conductively bonded to the three metalizations 104, 106, 126. These electrical leads 110, 112, 124 are shown in phantom in FIGS. 3 and 4 to illustrate their placement for this embodiment.

It should be understood, however, that the third metalization 126, while desirable for the purposes of bonding the third electrical lead 124 to the header 100, can be extended, altered in shape or eliminated, as desired. For example, the third electrical lead 124 can be mounted directly to the bottom surface of the header 100.

Figure 5:
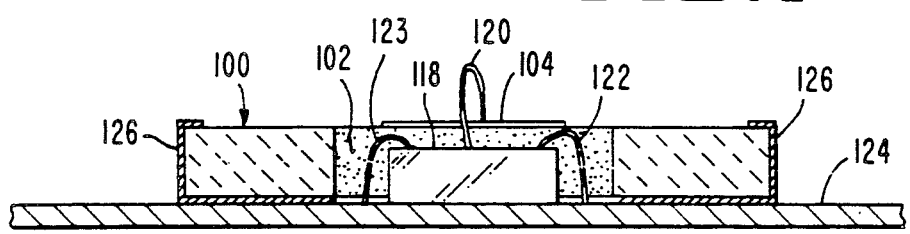
FIG. 5 illustrates a cross-sectional view taken along line 5—5 in FIG. 2.

Referring to FIG. 5, the mounting of the third electrical lead 124 to the header 100 and the mounting of the transistor chip 118 thereto can be better understood. As seen in the cross-sectional view of FIG. 5 (taken along line 5—5 of FIG. 2), the third electrical lead 124 is bonded to the third header metalization 126 on the bottom surface of the header 100. The transistor chip 118 is disposed within the aperture 102 and mounted directly on the electrical lead 124.

As discussed above, and particularly in view of FIG. 5, it should be appreciated that with the header 100 of the present invention, the transistor chip 118 can be mounted directly upon one of the electrical leads 124 which provides external connectivity. As further discussed above, this minimizes the electrical and thermal paths between one or more terminal pads and the substrate, respectively, of the transistor chip 118 and this electrical lead 124. Therefore, the parasitic electrical and thermal impedances between the transistor chip 118 and this lead 124 are minimized as much as possible. Such minimization of these parasitic electrical and thermal impedances simplify the typical design problem of tuning out the parasitic electrical impedance, and allow the transistor 118 to be operated at higher power, as desired.

It should be understood that various alternatives to the embodiments of the present invention described herein can be employed in practicing the present invention. It is intended that the following claims define the scope of the present invention, and that structures and methods within the scope of these claims and their equivalents be covered thereby.

What is claimed is:

1. A semiconductor chip header, comprising:
   an electrically insulative member having first and second planar surfaces, and further having a circumferential edge with first and second edge areas connecting said first and second planar surfaces;
   an aperture within and extending through said insulative member and connecting said first and second planar surfaces; and
   a first metalization covering a first portion of said first planar surface, said first circumferential edge area and a first portion of said second planar surface.

2. A semiconductor chip header as recited in claim 1, wherein at least part of said first metalization comprises a microstripline.

3. A semiconductor chip header as recited in claim 1, further comprising a third metalization covering a third portion of said second planar surface, wherein said third metalization is electrically insulated from said first metalization.

4. A semiconductor chip header as recited in claim 1, further comprising a second metalization covering a second portion of said first planar surface, said second circumferential edge area and a second portion of said second planar surface, wherein said second metalization is electrically insulated from said first metalization.

5. A semiconductor chip header as recited in claim 4, wherein at least part of said second metalization comprises a microstripline.

6. A package for a semiconductor chip, comprising:
   an electrically insulative member having first and second planar surfaces, and further having a circumferential edge with first and second edge areas connecting said first and second planar surfaces;
   an aperture within and extending through said insulative member and connecting said first and second planar surfaces;
   a first metalization covering a first portion of said first planar surface, said first circumferential edge area and a first portion of said second planar surface;
   a first lead electrically coupled to said first metalization at said first portion of said second planar surface; and
   a second lead coupled to said second planar surface and at least partially covering said member aperture.

7. A semiconductor chip package as recited in claim 6, further comprising a third metalization covering a third portion of said second planar surface, wherein said second lead is electrically coupled thereto, and wherein said third metalization is electrically insulated from said first metalization.

8. A semiconductor chip package as recited in claim 6, wherein at least part of said first metalization comprises a microstripline.

9. A semiconductor chip package as recited in claim 6, further comprising a second metalization and a third lead electrically coupled to said second metalization, wherein said second metalization covers a second portion of said first planar surface, said second circumferential edge area and a second portion of said second planar surface, and is electrically insulated from said first metalization.

10. A semiconductor chip package as recited in claim 9, wherein at least part of said second metalization comprises a microstripline.

11. A packaged semiconductor chip, comprising:
   an electrically insulative header having top and bottom planar surfaces, and further having circumferential first and second edges areas connecting said top and bottom planar surfaces;
   an aperture within and extending through said header and connecting said top and bottom planar surfaces;
   a first metalization covering a first portion of said top planar surface, said first circumferential edge area and a first portion of said bottom planar surface;
   a first lead electrically coupled to said first metalization at said first portion of said second planar surface;
   a second lead coupled to said bottom planar surface and at least partially covering said header aperture; and
   a semiconductor chip disposed within said header aperture and coupled to said second lead.

12. A packaged semiconductor chip as recited in claim 11, further comprising a third metalization covering a third portion of said bottom planar surface, wherein said second lead is electrically coupled thereto, and wherein said third metalization is electrically insulated from said first metalization.

13. A packaged semiconductor chip as recited in claim 11, wherein at least part of said first metalization comprises a microstripline.

14. A packaged semiconductor chip as recited in claim 11, further comprising a second metalization and a third lead electrically coupled to said second metalization, wherein said second metalization covers a second portion of said top planar surface, said second circumferential edge area and a second portion of said bottom planar surface, and is electrically insulated from said first metalization.

15. A packaged semiconductor chip as recited in claim 14, wherein at least part of said second metalization comprises a microstripline.

16. A semiconductor chip header as recited in claim 4, further comprising a third metalization covering a third portion of said second planar surface, wherein said third metalization is electrically insulated from said second metalization.

* * * * *